United States Patent
Yasuda

(10) Patent No.: US 7,462,847 B2
(45) Date of Patent: Dec. 9, 2008

(54) ION IMPLANTER AND ION IMPLANTATION CONTROL METHOD THEREOF

(75) Inventor: Satoshi Yasuda, Toyama (JP)

(73) Assignee: Panasonic Corporation, Osaka (JP)

( * ) Notice: Subject to any disclaimer, the term of this patent is extended or adjusted under 35 U.S.C. 154(b) by 181 days.

(21) Appl. No.: 11/502,494

(22) Filed: Aug. 11, 2006

(65) Prior Publication Data

US 2007/0114456 A1 May 24, 2007

(30) Foreign Application Priority Data

Oct. 28, 2005 (JP) ............................. 2005-313601

(51) Int. Cl.
*H01J 37/30* (2006.01)

(52) U.S. Cl. ............................................. 250/492.21
(58) Field of Classification Search ............ 250/492.21, 250/397, 398
See application file for complete search history.

(56) References Cited

U.S. PATENT DOCUMENTS 5,811,823 A * 9/1998 Blake et al. ............ 250/492.21

FOREIGN PATENT DOCUMENTS

| JP | 62-071154 | 4/1987 |
|---|---|---|
| JP | 05-067449 | 3/1993 |
| JP | 06-275219 | 9/1994 |
| JP | 10-012179 | 1/1998 |
| JP | 10-116581 | 5/1998 |
| JP | 2001-167727 | 6/2001 |
| JP | 2002-042716 | 2/2002 |
| JP | 2004-356297 | 12/2004 |

* cited by examiner

*Primary Examiner*—Kiet T Nguyen
(74) *Attorney, Agent, or Firm*—Steptoe & Johnson LLP

(57) ABSTRACT

An ion implanter is provided with a system for monitoring parameters of the ion implanter in real time to control respective components in the ion implanter. This system is allowed to have a function of calculating an accumulated dose distribution during ion implantation treatment and correcting a mechanical scan speed of a wafer holding section in a Y direction so as to render an accumulated dose uniform, a function of changing a magnetic field of a mass analyzing section to thereby control a center position of an ion beam, and a function of varying a suppression voltage of an aperture and an ion beam current to control a diameter of the ion beam.

14 Claims, 8 Drawing Sheets

[DOSE UNIFORMITY IN Y DIRECTION = (MAXIMUM VALUE − MINIMUM VALUE)/2 × MEAN VALUE
0.45% in (a), 0.01% in (b)]

ION IMPLANTER AND ION IMPLANTATION CONTROL METHOD THEREOF

BACKGROUND OF THE INVENTION (1) Field of the Invention

The present invention relates to an ion implanter for implanting ions in a semiconductor wafer, and an ion implantation control method thereof. In particular, the present invention relates to an ion implanter capable of improving dose uniformity and suppressing generation of contaminated particles on a wafer, and an ion implantation control method thereof.

(2) Description of the Related Art

In an ion implanter, a technique for improving dose uniformity and a technique for reducing the number of particles are fundamental techniques, and various modifications have been made heretofore.

First, description will be given of the technique for improving dose uniformity.

An ion implanter mainly includes an ion source for generating ions, an extraction electrode (an accelerating section), a mass analyzing section for acquiring desired ions, an accelerating/decelerating section for acquiring desired energy, and an ion implanting section for holding a wafer to implant ions in the wafer.

A wafer holding method of the ion implanting section includes batch processing in which plural wafers are held in a disc, and single wafer processing in which a single wafer is held.

In the former batch processing, an ion beam is made stationary and a mechanical scan is performed in a radius direction while a disc is rotated at a high speed, so that dose uniformity is secured. This type is generally adopted in a high current ion implanter.

In the latter single wafer processing, there is mainly adopted a hybrid scan in which an ion beam scan section mechanically scans a wafer with an ion beam in one direction. This type is generally adopted in a medium current ion implanter. In recent years, a high current ion implanter of the single wafer processing type is also developed. Thus, there are devised an ion implanter of a hybrid scan type similar to that of the medium current ion implanter, an ion implanter for making an ion beam stationary without scan to mechanically scan a wafer in a horizontal direction and a longitudinal direction, an ion implanter for generating a ribbon beam obtained by expanding an ion beam in a horizontal direction, to mechanically scan a wafer in a longitudinal direction, and the like. In any of the aforementioned ion implanters, a mechanical scan is performed in at least one direction. In order to render an amount of ions implanted in a wafer uniform, an ion beam current is measured, and a speed of a mechanical scan mechanism is changed in accordance with variation of an amount of the measured ion beam current. More specifically, a control system used in each of the aforementioned ion implanters controls a mechanical scan speed in such a manner that a dose at the time when a wafer is scanned once with an ion beam (at the time when a disc rotates once in a batch processing ion implanter) is invariant. However, in some cases, an amount of ions implanted in a wafer becomes nonuniform in a mechanical scan direction due to a characteristic of an ion implanter, and other reasons.

In order to solve the aforementioned problem, for example, JP2001-167727A discloses an ion implantation system. This ion implantation system feeds back characteristic data of a wafer measured after being subjected to ion implantation treatment, corrects a mechanical scan speed, and prevents nonuniformity of ion implantation due to a characteristic of an ion implanter.

Next, description will be given of the technique for reducing the number of particles.

Materials for the ion source, the extraction electrode, a wafer holding section of the ion implanting section, and the like are devised to suppress generation of particles. Further, a particle generation source is identified and is subjected to maintenance such that particles on a wafer are reduced in number. For example, JP2004-356297A discloses a particle reduction method. Herein, plural particle monitors are placed over a whole beam line including an ion source, a mass analyzing section, an accelerating/decelerating section and the like in addition to an ion implanting section in an ion implanter, so that a site where particles are generated can be identified immediately. Further, if the site where particles are generated is located on the beam line, a diameter of an ion beam is set to a predetermined diameter by a rise in extraction/acceleration voltage, and the like, so that generation of the particles can be suppressed.

In the ion implanter and the ion implantation method that are well-known, however, the following problems arise.

The ion implantation system disclosed in JP2001-167727A can feed back and correct the characteristic data of the ion implanter. However, if the ion implanter is operated for a long period of time, an ion beam current suddenly varies due to a change in state of the ion implanter during the ion implantation treatment in many cases. If the sudden variation of the ion beam current occurs, the characteristic data of the ion implanter cannot be corrected. In addition, if the ion beam current suddenly varies upon implantation of ions in a wafer having a characteristic to be measured, the characteristic data of the ion implanter is corrected on the basis of the characteristic of the wafer; therefore, there is a possibility that dose uniformity becomes poor. In order to address the sudden variation of the ion beam current, it is considered that an interlock is provided for suspending processing if the ion beam current varies significantly beyond a set value. However, if a range of the set value is too narrow, there is a fear that a wafer processability deteriorates. In contrast, if such a range is too wide, dose uniformity becomes poor, leading to the same adverse result as the aforementioned description.

On the other hand, with the particle reduction method disclosed in JP2004-356297A, an extraction/acceleration voltage is allowed to rise upon adjustment of the diameter of the ion beam, and an acceleration voltage at a later stage is allowed to drop. In many cases, however, the extraction/acceleration voltage is already maximum in a normal state for the purpose of acquiring a larger amount of ion beam currents. This method cannot be applied in such a case. In addition, if the acceleration voltage is allowed to drop at a later stage like a high current ion implanter, there is a possibility that an increase in energy contamination is caused. Further, in addition to the diameter of the ion beam, a center position of the ion beam is also deeply involved in generation of particles. Upon maintenance of the ion implanter, an orbit of the ion beam disadvantageously deviates due to changes in state of the ion implanter, such as erroneous attachment of an exchanged ion source, a chipped slit in an extraction electrode, and adhesion of deposits, so that an area, irradiated with the ion beam, of a component located on the orbit of the ion beam is enlarged. As a result, particles are easily generated, leading to deterioration in yield of a semiconductor device product and reduction in operating time of the ion implanter.

SUMMARY OF THE INVENTION

The present invention is made to solve the aforementioned problems, and it is therefore an object of the present invention to provide an ion implanter capable of keeping dose uniformity at a good state without deterioration in wafer processability and, also, capable of suppressing generation of particles as much as possible even when an ion beam state changes due to a change in state of the ion implanter every moment over a long operation period, and an ion implantation control method thereof.

In order to achieve the aforementioned object, in an ion implanter and an ion implantation control method thereof according to the present invention, there are provided an ion source, an extraction accelerating section for extracting an ion beam from the ion source, a mass analyzing section for acquiring desired ions from the ion beam extracted by the extraction accelerating section, a wafer holding section for holding a wafer in which ions are to be implanted, an aperture having a function of removing redundant ions and particles from an ion beam outputted from the mass analyzing section so that such ions and particles do not reach the wafer held by the wafer holding section, a dose controller for measuring an ion beam current during implantation of ions in the wafer to control an amount of ions to be implanted in the wafer, a mechanical scan mechanism for allowing the wafer holding section to reciprocate, and a mechanical scan mechanism controller for measuring a mechanical scan position of the wafer holding section reciprocated by the mechanical scan mechanism and a mechanical scan speed of the mechanical scan mechanism to control the mechanical scan mechanism. Herein, a real-time monitoring and controlling system has an ion implanter interlock function of computing an accumulated dose distribution in a mechanical scan direction from the ion beam current, the mechanical scan speed and the mechanical scan position each measured in real time, computing accumulated dose distribution uniformity from the accumulated dose distribution thus computed and, if the uniformity exceeds a certain value, stopping wafer processing, for each mechanical scan of the wafer holding section by the mechanical scan mechanism.

In the ion implanter and the ion implantation control method thereof according to the present invention, the real-time monitoring and controlling system has a scan speed correction and computation function of obtaining a correction value for correcting the mechanical scan speed in the mechanical scan direction so as to render the accumulated dose uniform in a subsequent mechanical scan, from an accumulated dose distribution at a certain point in time, and transmitting the correction amount thus obtained to the mechanical scan mechanism controller.

In the ion implanter and the ion implantation control method thereof according to the present invention, the real-time monitoring and controlling system has a function of controlling a center position of the ion beam with the use of a change in magnetic field of the mass analyzing section to thereby correct an orbit of the ion beam.

In the ion implanter and the ion implantation control method thereof according to the present invention, the real-time monitoring and controlling system has a function of acquiring a relation between the change in magnetic field of the mass analyzing section and the center position of the ion beam to determine whether or not the orbit of the ion beam is abnormal, during a period that the ion implanter dose not carry out wafer processing or after maintenance.

In the ion implanter and the ion implantation control method thereof according to the present invention, the real-time monitoring and controlling system has a function of changing a suppression voltage in the aperture or the amount of the ion beam current on the basis of the number of particles measured by particle counting sections provided for measuring the number of particles in the ion implanter, and adjusting a diameter of the ion beam.

DESCRIPTION OF THE PREFERRED EMBODIMENTS

Hereinafter, description will be given of preferred embodiments of the present invention with reference to the drawings.

First Embodiment

Figure 1:
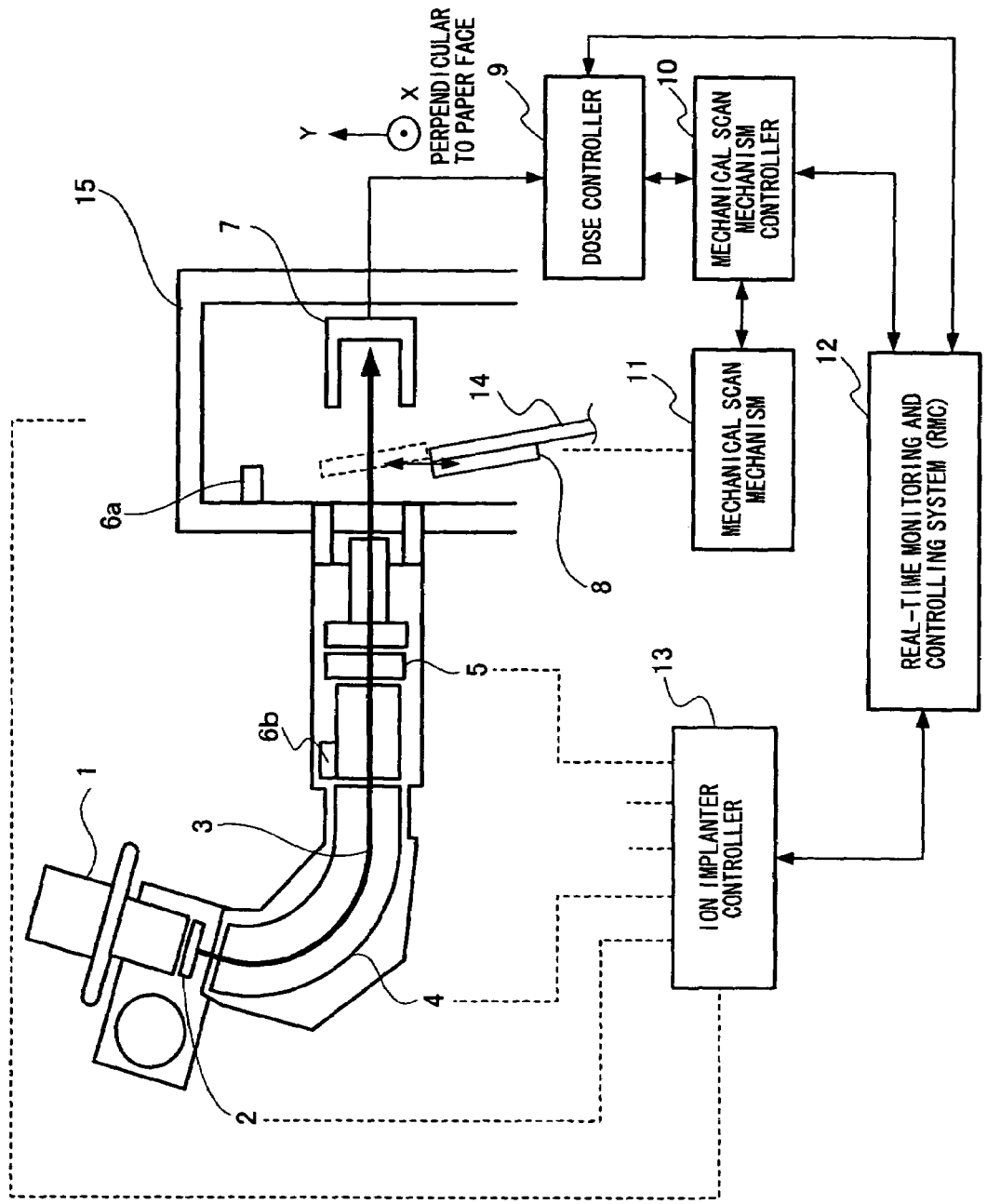
FIG. 1 is a schematic diagram illustrating a configuration of an ion implanter according to one embodiment of the present invention.

FIG. 1 schematically illustrates a configuration of an ion implanter according to a first embodiment of the present invention.

As illustrated in FIG. 1, the ion implanter includes: an ion source 1; an extraction electrode (an extraction accelerating section) 2 for extracting an ion beam 3 from the ion source 1; a mass analyzing section 4 for acquiring desired ions of the ion beam 3 extracted by the extraction electrode 2; an aperture (an opening) 5 having a function of removing redundant ions and particles from an ion beam outputted from the mass analyzing section 4 so that such ions and particles do not reach a (semiconductor) wafer 8; a particle monitor (a particle counting section) 6a for measuring the number of particles in an end-station 15; a particle monitor (a particle counting section) 6b arranged on an upstream side of the aperture 5 to measure the number of particles; a dose Faraday cup 7 provided in the end-station 15 to receive the ion beam 3 upon implantation of ions in the wafer 8; a dose controller 9 for measuring a current value and a center position (a coordinate) of the ion beam 3 received by the dose Faraday cup 7 during the implantation of ions in the wafer 8 to control an amount of ions to be implanted in the wafer 8; a wafer holding section 14 provided in the end-station 15 to hold the wafer 8; a mechanical scan mechanism 11 provided in the end-station 15 to allow the wafer holding section 14 to reciprocate by means of a scan motor or the like; a mechanical scan mechanism controller 10 for measuring a mechanical scan position of the wafer holding section 14 and a mechanical scan speed of the mechanical scan mechanism 11 to control a mechanical scan speed of the wafer holding section 14; an ion implanter controller 13 for accepting an input of the number of particles measured by the particle monitors 6a and 6b to control an extraction voltage of the extraction electrode 2, a magnetic field of the mass analyzing section 4, and a suppression voltage of the aperture 5; and a real-time monitoring and controlling system 12, configured by a computer, for monitoring parameters of the ion implanter in real time to control the respective components in the ion implanter.

According to this configuration of the ion implanter, the ion beam 3 extracted by the extraction electrode 2 from the ion source 1 passes the mass analyzing section 4, the aperture 5 and the like and, then, is implanted in the wafer 8. The dose Faraday cup 7 receives the ion beam 3 upon implantation of ions in the wafer 8. The mechanical scan mechanism controller 10 computes a mechanical scan speed to control the mechanical scan mechanism 11 on the basis of the ion beam current measured by the dose controller 9 and the mechanical scan position of the wafer holding section 14 measured by the mechanical scan mechanism controller 10.

Next, description will be given of a mechanical scan speed control method of the mechanical scan mechanism controller 10.

A direction in which the mechanical scan mechanism 11 for adjusting a speed allows the wafer holding section 14 to reciprocate is defined as a Y direction (a vertical direction in FIG. 1). An X direction corresponds to a rotational direction (at a fixed speed) of the wafer holding section 14, i.e., a disc, in the case of a batch processing ion implanter (a direction perpendicular to a paper face of FIG. 1), and corresponds to an ion beam scan direction in the case of a single wafer processing ion implanter of a hybrid scan type. In the case of the single wafer processing ion implanter, a mechanical scan speed in the Y direction is changed in accordance with variation in ion beam. In the case of the batch processing ion implanter, in addition thereto, a rotational speed of the wafer holding section 14, i.e., the disc, is kept at a fixed speed, so that a circumferential speed becomes slow in the vicinity of a rotation center of the disc and becomes fast in the vicinity of a periphery of the disc. Therefore, the mechanical scan speed in the Y direction is changed in accordance with such a circumferential speed so that an amount of ions to be implanted becomes uniform. Hereinafter, description will be given of the case of the batch processing ion implanter as an example.

When an ion beam current acquired with respect to a certain set value is $I_B$ (mA), in each mechanical scan position Y (mm), the mechanical scan mechanism controller 10 controls a mechanical scan speed $V_Y$ (mm/sec) in the Y direction on the basis of the following equation (1) such that a dose $D_R$ per one scan (one rotation) in the X direction is invariant.

$$D_R = AI_B/(YV_Y) = \text{invariant[ions/cm}^2] \tag{1}$$

Herein, A is a constant (A=1/(2πnq)), n is a valance of an ion, and q is an elementary charge (1.602×10$^{-19}$C).

That is, the mechanical scan mechanism controller 10 uses, as a speed command value, the mechanical scan speed $V_Y$ (mm/sec) obtained from the equation (1) to control the mechanical scan speed while feeding back the mechanical scan speed thus measured.

Figure 2:
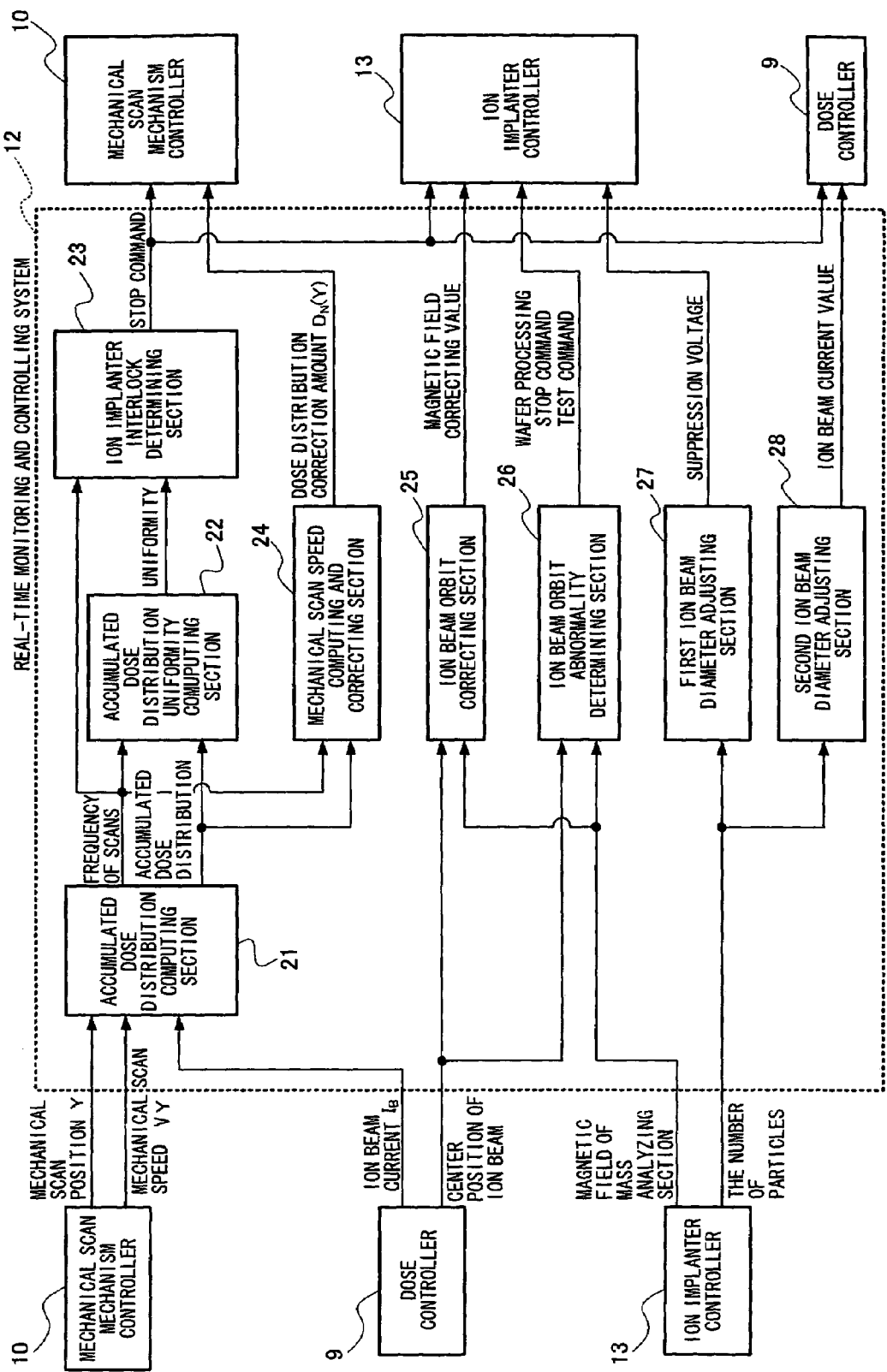
FIG. 2 is a control diagram illustrating a configuration of a real-time monitoring and controlling system of the ion implanter.

As illustrated in FIG. 2, the real-time monitoring and controlling system 12 accepts inputs of the mechanical scan position Y of the wafer holding section 14 and the mechanical scan speed $V_Y$ of the mechanical scan mechanism 11, each measured by the mechanical scan mechanism controller 10 in real time, and an input of the ion beam current $I_B$ measured by the dose controller 9.

The real-time monitoring and controlling system 12 includes an accumulated dose distribution computing section 21, an accumulated dose distribution uniformity computing section 22 and an ion implanter interlock determining section 23.

For each mechanical scan in the Y direction, the accumulated dose distribution computing section 21 obtains a frequency of mechanical scans in the Y direction from the measured ion beam current, mechanical scan speed and mechanical scan position. Further, the accumulated dose distribution computing section 21 computes a dose distribution in the mechanical scan direction (in the Y direction), and accumulates this dose distribution to compute an accumulated dose distribution in the mechanical scan direction (in the Y direction).

The accumulated dose distribution uniformity computing section 22 computes accumulated dose distribution uniformity from the accumulated dose distribution computed by the accumulated dose distribution computing section 21, for each mechanical scan in the Y direction.

For each mechanical scan in the Y direction, the ion implanter interlock determining section 23 determines whether or not the accumulated dose distribution uniformity computed by the accumulated dose distribution uniformity computing section 22 exceeds a preset value (a value of ion implanter interlock). If it is determined that the computed uniformity exceeds the preset value, the ion implanter interlock determining section 23 issues a wafer processing stop command to the dose controller 9, the mechanical scan mechanism controller 10 and the ion implanter controller 13 to stop wafer processing.

According to this configuration, the real-time monitoring and controlling system 12 has an ion implanter interlock function of, for each mechanical scan in the Y direction, computing the accumulated dose distribution in the mechanical scan direction from the measured beam current, mechanical scan speed and mechanical scan position, computing the accumulated dose distribution uniformity from the accumulated dose distribution and, if the computed uniformity exceeds a preset value (a value of ion implanter interlock), issuing a wafer processing stop command to the dose controller 9, the mechanical scan mechanism controller 10 and the ion implanter controller 13 to stop wafer processing. Hereinafter, specific description will be given of this function.

Figure 3:
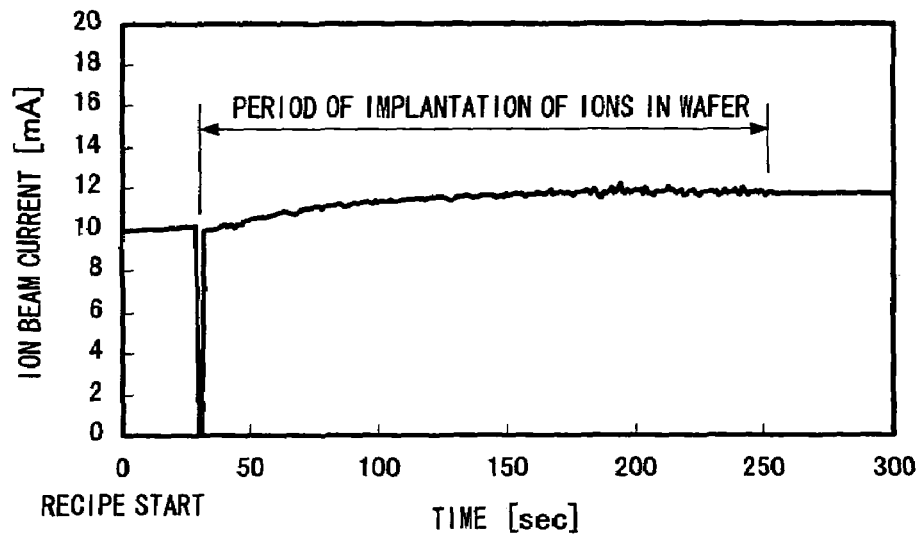
FIG. 3 is a graph showing an ion beam current in the ion implanter.

It is herein assumed that ion implantation treatment starts and the ion beam current $I_B$ varies as shown in FIG. 3. In this example, a set value for an ion beam current is 10 mA, a set value for a dose is 1.1×10$^{15}$ ions/cm$^2$, and a frequency of scans in the Y direction is 22. Herein, the distribution of the dose in the Y direction in the first scan in the Y direction is made uniform by controlling the mechanical scan speed $V_Y$ in the Y direction on the basis of the equation (1). However, if the ion beam current $I_B$ significantly varies, in actual, the distribution of the dose does not become uniform as shown by a curve (a) in FIG. 4. The reason therefor is as follows. The ion beam current $I_B$ at this point in time is calculated from one or more ion beam current measurements in the past, on the basis of the ion beam current measured for each rotation of the disc (for each scan in the X direction) and a mechanical scan speed until a subsequent rotation is calculated and controlled. Therefore, a follow ability thereof has limitations.

Figure 4:
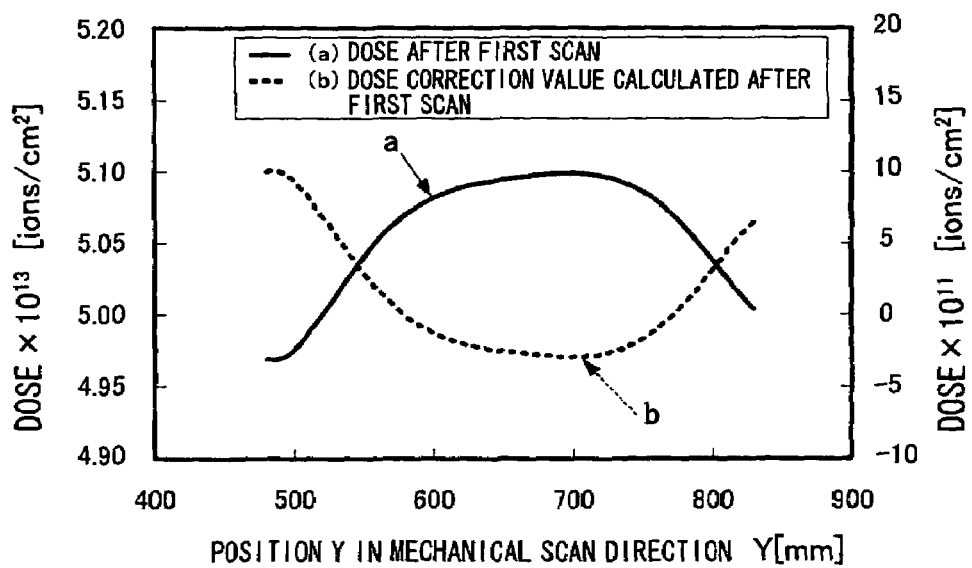
FIG. 4 is a graph showing distribution of a dose and a correction amount thereof after completion of a first scan in a Y direction in the ion implanter.

With the use of the equation (1), the accumulated dose distribution computing section 21 computes the dose $D_R$ of each mechanical scan position Y from the measured mechanical scan speed $V_Y$, for each mechanical scan in the Y direction, to obtain the dose distribution in the Y direction as shown in FIG. 4. Then, the accumulated dose distribution computing section 21 accumulates the dose distribution in the mechanical scan direction (in the Y direction) to compute the accumulated dose distribution. The accumulated dose distribution uniformity computing section 22 computes the accumulated dose distribution uniformity (%) from the accumulated dose distribution thus computed, for each mechanical scan in the Y direction.

Figure 5:
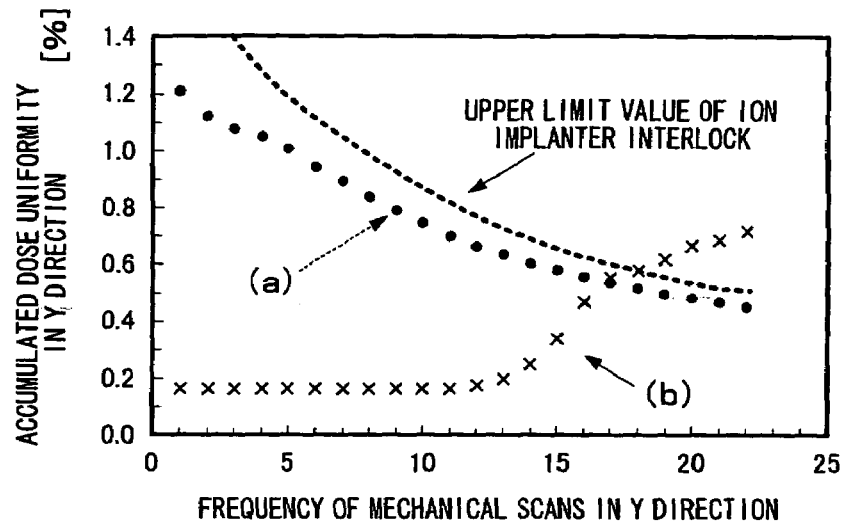
FIG. 5 is a graph showing transition in uniformity of an accumulated dose in the Y direction with respect to a frequency of scans in the ion implanter.

The uniformity (%) of the accumulated dose distribution in the Y direction shown by (a) in FIG. 4 is 1.2%. Subsequent to a second scan, similarly, the accumulated dose distribution in the Y direction is obtained. Thus, the uniformity is as shown by (a) in FIG. 5. In this example, since the variation of the ion beam current $I_B$ becomes small as the processing proceeds as shown in FIG. 3, the uniformity is improved. In contrast, if the ion beam current $I_B$ varies at a latter half of the processing, the accumulated dose distribution uniformity is as shown by (b) in FIG. 5.

The ion implanter interlock determining section 23 sets the value (%) of ion implanter interlock to the accumulated dose distribution uniformity (%), on the basis of the uniformity thus obtained. If the accumulated dose distribution uniformity (%) calculated for each scan in the Y direction exceeds the value (%) of ion implanter interlock, the ion implanter interlock determining section 23 issues the wafer processing stop command to stop the wafer processing.

Herein, the value of ion implanter interlock is not necessarily to be made invariant. For example, it is considered that, in order to keep uniformity of 0.5% eventually, curved ion implanter interlock is set so as to suppress the value of ion implanter interlock as the processing proceeds (the frequency of scans in the Y direction is increased) as shown by a broken line in FIG. 5.

As described above, according to the first embodiment, the real-time monitoring and controlling system 12 has the function of computing the accumulated dose distribution in the mechanical scan direction from the ion beam current, the mechanical scan speed and the mechanical scan position each measured in real time to compute the accumulated dose distribution uniformity from the distribution thus computed and, if the computed uniformity exceeds a preset value (a value of ion implanter interlock), stopping wafer processing, every time the mechanical scan mechanism 10 performs a mechanical scan. Thus, even when the state of the ion beam 3 is changed, it is possible to constantly keep the dose uniformity in the wafer 8 at a good state, and to improve a product yield and an ion implanter operating ratio.

Second Embodiment

Description will be given of a second embodiment of the present invention with reference to FIGS. 1 to 4 and 6 to 8. It is to be noted that a whole configuration of an ion implanter in the second embodiment is similar to that in the first embodiment; therefore, the same components are denoted by the same symbols and specific description thereof will not be given here.

In the first embodiment, when the ion beam current varies frequently, there is a fear that the operating ratio reduces due to the stoppage of processing by the ion implanter interlock. Accordingly, this embodiment realizes an ion implanter capable of keeping dose uniformity at a good state by a correction function even when an ion beam current varies.

As illustrated in FIG. 2, the real-time monitoring and controlling system 12 includes a mechanical scan speed computing and correcting section 24.

The mechanical scan speed computing and correcting section 24 obtains a correction amount for correcting the mechanical scan speed (the command value) of the mechanical scan mechanism 11 in the mechanical scan direction so as to render the accumulated dose uniform in a subsequent mechanical scan, from an accumulated dose distribution at a certain point in time (a mechanical scan in the Y direction) obtained by the accumulated dose distribution computing section 21. Then, the mechanical scan speed computing and correcting section 24 outputs the correction amount thus obtained to the mechanical scan mechanism controller 10 to correct the mechanical scan speed.

Hereinafter, specific description thereof will be given.

When ion implantation treatment starts and a first scan in the Y direction ends, the mechanical scan speed computing and correcting section 24 calculates a mean value $D_{1m}$ of an accumulated dose distribution $D_1$ (Y) in the Y direction obtained by the accumulated dose distribution computing section 21, and obtains a correction amount $\Delta D_1$ (Y) from the accumulated dose distribution $D_1$ (Y).

$$\Delta D_1(Y) = D_{1m} - D_1(Y) \tag{2}$$

The mechanical scan speed computing and correcting section 24 outputs, to the mechanical scan mechanism controller 10, the accumulated dose distribution correction amount $\Delta D_1$ (Y) as the correction amount. In a second scan, the mechanical scan mechanism controller 10 controls the mechanical scan speed $V_Y$ so as to render an accumulated dose invariant. This accumulative dose has the accumulated dose distribution correction amount $\Delta D_1$ (Y) taken into consideration. That is, the mechanical scan speed $V_Y$ is controlled on the basis of the following equation (3).

$$D_R + \Delta D_1(Y) = AI_B/(YV_Y) + \Delta D_1(Y) = \text{invariant[ions/cm}^2] \tag{3}$$

Similarly, for each mechanical scan in the Y direction, the mechanical scan speed computing and correcting section 24 calculates a mean value $D_{Nm}$ of the accumulated dose distribution $D_N$ (Y) in the Y direction obtained by the accumulated dose distribution computing section 21, obtains a correction amount $\Delta D_N$ (Y) from the accumulated dose distribution $D_N$ (Y), and outputs the correction amount $\Delta D_N$(Y) thus obtained to the mechanical scan mechanism controller 10. In a (N+1)th scan, the mechanical scan mechanism controller 10 controls the mechanical scan speed $V_Y$ so as to render an accumulated dose invariant. This accumulated dose has the correction amount $\Delta D_N$(Y) obtained from the accumulated dose distribution $D_N$ (Y) taken into consideration. That is, the mechanical scan speed $V_Y$ is controlled on the basis of the following equation (4).

$$D_R + \Delta D_N(Y) = AI_B/(YV_Y) + \Delta D_N(Y) = \text{invariant[ions/cm}^2] \quad (4)$$

Figure 6:
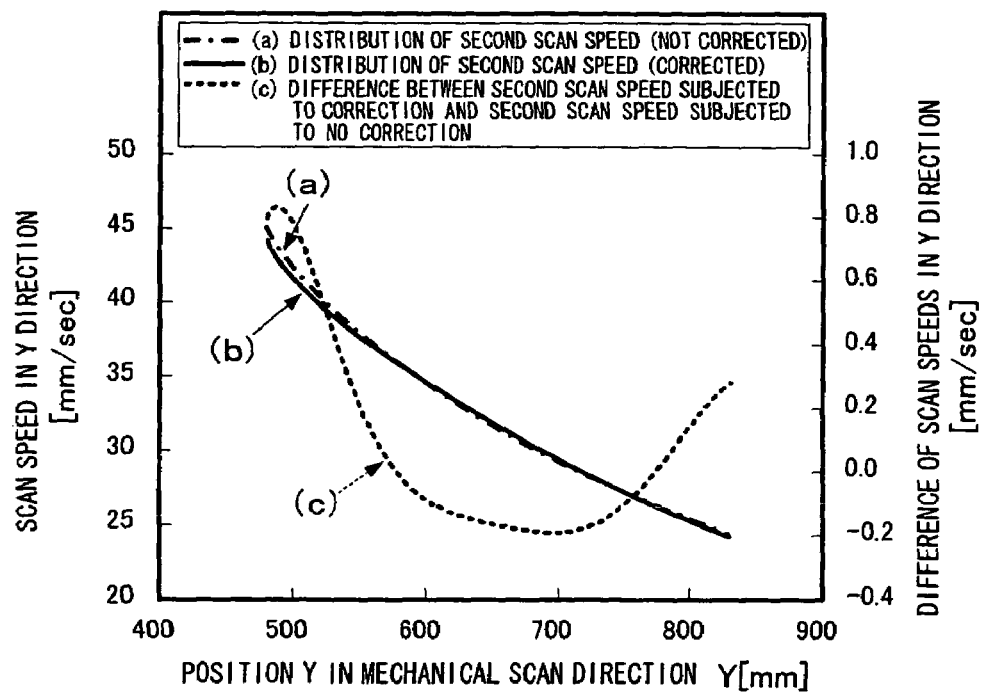
FIG. 6 is a graph showing distribution of a scan speed upon a second scan in the Y direction in the ion implanter.
Figure 7:
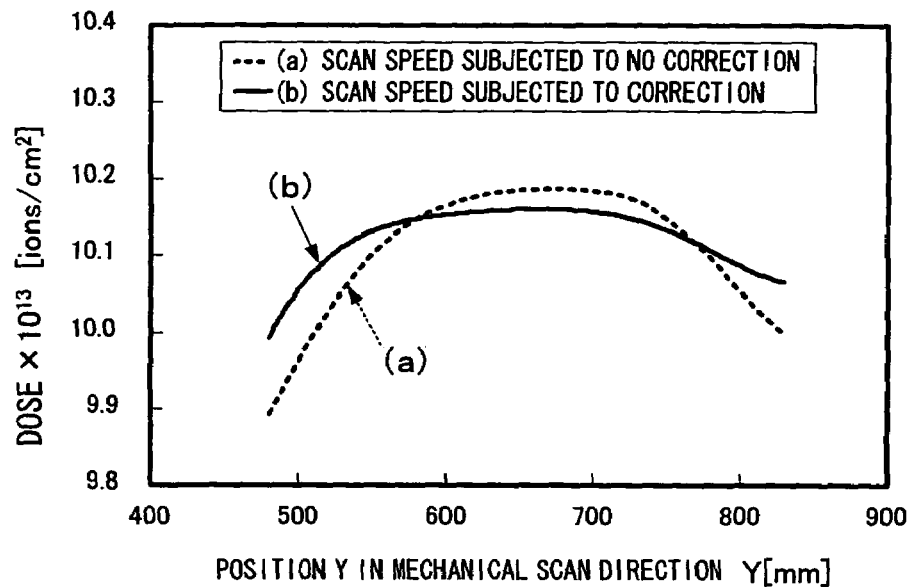
FIG. 7 is a graph showing distribution of a dose after completion of the second scan in the Y direction in the ion implanter.
Figure 8:
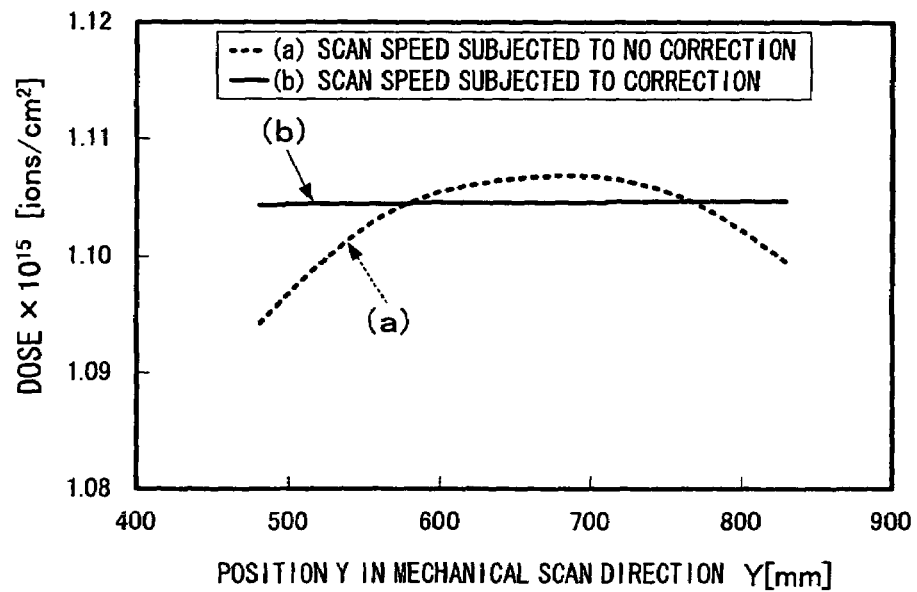
FIG. 8 is a graph showing distribution of a dose after completion of ion implantation in the ion implanter.

Using these equations, results of simulation of an improvement effect of dose uniformity in the case that an ion beam current actually varies are as follows. When the correction amount is obtained from the dose distribution of the first scan in the Y direction, on the basis of the equation (2), a result thereof is as shown by a curve (b) in FIG. 4. When the distribution of the mechanical scan speed in the Y direction in the second scan is obtained from the dose correction amount in the first scan shown by the curve (b) in FIG. 4, on the basis of the equation (4), a result thereof is as shown by (b) in FIG. 6. For reference, (a) in FIG. 6 shows the distribution subjected to no correction. In addition, (c) in FIG. 6 shows a difference between the mechanical scan speed in the Y direction subjected to correction and the mechanical scan speed in the Y direction subjected to no correction. When ions are implanted while the correction of the mechanical scan speed in the Y direction is taken into consideration into the second scan, the distribution of the accumulated dose after completion of the second scan is as shown by (b) in FIG. 7 ((a) in FIG. 7 shows a case of the distribution subjected to no correction). The correction is repeatedly performed and, finally, the distribution of the accumulated dose after completion of the ion implantation is as shown by (b) in FIG. 8 ((a) in FIG. 8 shows a case of the distribution subjected to no correction).

As described above, according to the second embodiment, the real-time monitoring and controlling system 12 has the scan speed correction and computation function of obtaining the correction value for correcting the mechanical scan speed in the mechanical scan direction (the mechanical scan speed in the Y direction) so as to render the accumulated dose uniform in a subsequent mechanical scan, from the accumulated dose distribution at a certain point in time (the first scan in the Y direction in the second embodiment; however, this point in time may be a second scan or a subsequent scan), and transmitting the correction amount thus obtained to the mechanical scan mechanism controller 10. Therefore, even when the state of an ion beam is changed, it is possible to dramatically improve the accumulated dose distribution uniformity in the Y direction, and it is possible to enhance a product yield and an ion implanter operating ratio. In the second embodiment, the correction of the mechanical scan speed in the Y direction is performed, so that the accumulated dose distribution uniformity in the Y direction can be dramatically improved from 0.45% to 0.01%.

If the ion beam current significantly varies, the correction amount of the mechanical scan speed in the Y direction becomes large. As a result, an implantation amount to be corrected, corresponding thereto, is disadvantageously corrected at a time. In this case, a density and a shape of the ion beam are changed; therefore, there is a possibility that wafer characteristics such as an actual sheet resistance and a Therma-Wave value are still nonuniform. In addition, in a single wafer processing high current ion implanter or the like, when an ion beam is applied to one portion for a long time, there is a fear that charge-up occurs. Accordingly, it is also assumed that the correction must be made in the remaining scans in the Y direction in a division manner as much as possible so as to avoid the sudden variation of the mechanical scan speed. That is, a certain threshold value is set to a variation value of accumulated dose distribution. If an ion beam varies beyond the threshold value, the dose calculated for each scan in the Y direction is not corrected at a subsequent scan in the Y direction, but is corrected using a value obtained by dividing a set dose by a remaining frequency of scans $N_R$ that can be calculated from a remaining dose, so that nonuniformity that may occur at the time of correction can be reduced. Similar to the equation (4), the following equation (5) is established. The mechanical scan speed $V_Y$ is controlled on the basis of the equation (5).

$$D_R + \Delta D_N(Y)/N_R = AI_B/(YV_Y) + \Delta D_N(Y)/N_R = \text{invariant} \\ \text{[ions/cm}^2] \quad (5)$$

The mechanical scan speed computing and correcting section 24 computes $\Delta D_N(Y)/N_R$, and outputs the resultant to the mechanical scan mechanism controller 10.

In the second embodiment, if an ion beam current varies at the time of the final scan in the Y direction in the ion implantation treatment, subsequent scan processing is not performed. Therefore, dose nonuniformity caused thereby cannot be corrected. In addition, if the correction is made in the remaining scans in a division manner, the ion beam current significantly varies at a latter half of the ion implantation treatment. Further, if the variation amount is diverged, the nonuniformity cannot be corrected sufficiently. If the large variation of the ion beam current, that causes problems of nonuniformity and charge-up, occurs, an ion implanter interlock is provided as in the first embodiment so as to suspend the ion implantation treatment.

In a single wafer processing ion implanter, a dose per scan has no dependency of a position in the Y direction. Therefore, such a dose can be obtained from the following simpler equation.

$$D_R + \Delta D_N(Y) = I_B/(nqWV_Y) + \Delta D_N(Y) = \text{invariant[ions/} \\ \text{cm}^2] \quad (6), \text{or}$$

$$D_R + \Delta D_N(Y)/N_R = I_B/(nqWV_Y) + \Delta D_N(Y)/N_R = \text{invariant} \\ \text{[ions/cm}^2] \quad (7)$$

Herein, W is a scan width in the X direction. This scan width may be a mechanical scan width or an ion beam scan width. In the case of using an ion implanter for generating a ribbon beam or the like obtained by expanding an ion beam in the X direction, the scan width corresponds to a width of the ion beam.

Third Embodiment

Description will be given of a third embodiment of the present invention with reference to FIGS. 1, 2, 9 and 10. It is to be noted that a whole configuration of an ion implanter in the third embodiment is similar to that in the first embodiment; therefore, the same components are denoted by the same symbols and specific description thereof will not be given here.

As illustrated in FIG. 2, the real-time monitoring and controlling system 12 accepts an input of a magnetic field applied in the mass analyzing section 4 from the ion implanter controller 13, and an input of a measured center position of the ion beam 3 in the Y direction (the center position of the ion beam 3 in the Y direction) from the dose controller 9.

As illustrated in FIG. 2, the real-time monitoring and controlling system 12 includes an ion beam orbit correcting section 25 and an ion beam orbit abnormality determining section 26.

The ion beam orbit correcting section 25 obtains a correction value of the magnetic field applied in the mass analyzing section 4 on the basis of the magnetic field of the mass analyzing section 4 and the center position of the ion beam 3 in the Y direction, each inputted thereto. The correction value is used for correcting an orbit of the ion beam 3.

During the standby of the ion implanter (a period that the ion implanter does not carry out the wafer processing) or during the activation of the ion implanter after maintenance, the ion beam orbit abnormality determining section 26 determines whether or not the orbit of the ion beam 3 is abnormal, on the basis of the magnetic field of the mass analyzing section 4 and the center position of the ion beam 3 in the Y direction.

Figure 9:
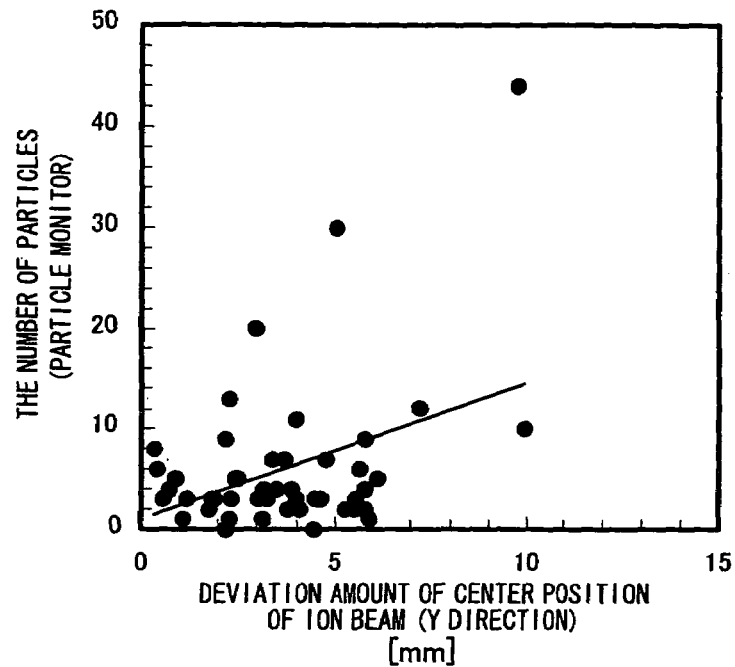
FIG. 9 is a plot showing a relation between a deviation amount (in a Y direction) of a center position of an ion beam and the number of particles in the ion implanter.
Figure 10:
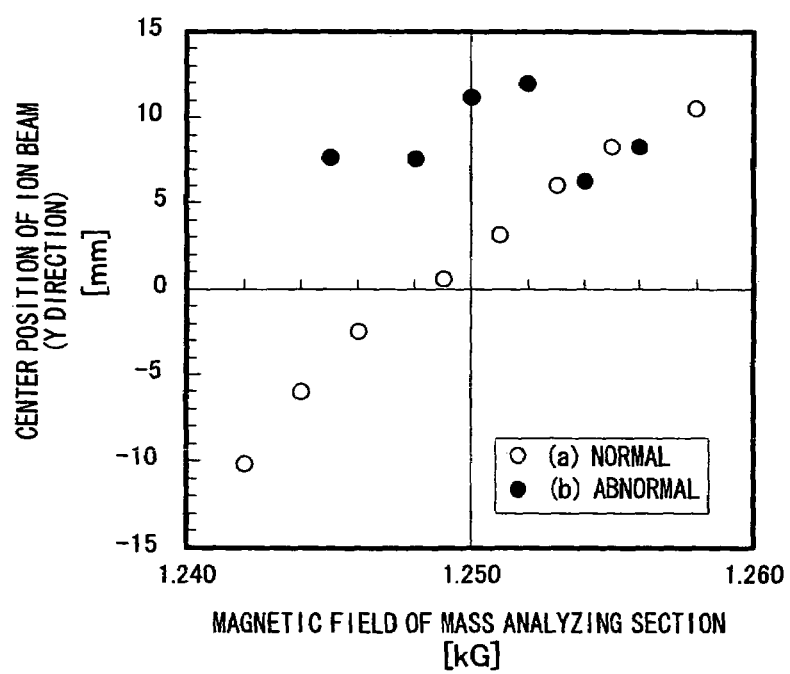
FIG. 10 is a plot showing a relation between a magnetic field of a mass analyzing section and a center position of an ion beam (in a Y direction) in the ion implanter.

As illustrated in FIG. 1, when the orbit of the ion beam 3 emitted from the ion source 1 deviates, a possibility that slits of the extraction electrode 2, aperture 5 and the like located on the path are irradiated with the ion beam 3 becomes high, so that particles are easily generated. FIG. 9 shows a relation between the deviation of the center of the ion beam 3 in the Y direction and the number of particles (acquired by the particle monitor 6a in this case). It is apparent from FIG. 9 that particles are easily generated if the center of the ion beam 3 deviates. FIG. 10 shows a relation (a characteristic) between the magnetic field of the mass analyzing section 4 and the center position of the ion beam 3 in the Y direction.

The ion beam orbit correcting section 25 previously stores the relation between the magnetic field of the mass analyzing section 4 and the center position of the ion beam 3 in the Y direction in the normal case shown by (a) in FIG. 10. The ion beam orbit correcting section 25 obtains the deviation amount based on a set value (1.250 kG in FIG. 10) of the magnetic field of the mass analyzing section 4, from the deviation in the Y direction to output the deviation amount thus obtained to the ion implanter controller 13 as the correction value for the magnetic field. The ion implanter controller 13 changes the magnetic field of the mass analyzing section 4 on the basis of the correction value of the magnetic field and controls the center position of the ion beam 3 to thereby correct the orbit of the ion beam 3.

As described above, the magnetic field of the mass analyzing section 4 is changed on the basis of the relation shown by (a) in FIG. 10, so that the center position of the ion beam 3 can be controlled. Further, the orbit of the ion beam 3 is constantly controlled, so that the generation of the particles can be suppressed.

In addition, it is possible to determine whether or not the orbit of the ion beam 3 deviates, with the use of the relation between the magnetic field of the mass analyzing section 4 and the center position of the ion beam 3. In FIG. 10, (b) shows the case that the orbit of the ion beam 3 is abnormal. If the orbit of the ion beam 3 generated by the ion source 1 deviates as shown by (b) in FIG. 10, the center position of the ion beam 3 cannot be controlled even when the magnetic field of the mass analyzing section 4 is changed.

During the standby of the ion implanter or the during the activation of the ion implanter after maintenance, the ion beam orbit abnormality determining section 26 issues a test command to the ion implanter controller 13, changes the magnetic field of the mass analyzing section 4, and acquires the data of the center position of the ion beam 3. If the linear relation as shown by (a) in FIG. 10 is established, the ion beam orbit abnormality determining section 26 determines that the orbit of the ion beam 3 is normal. On the other hand, if the unbalanced relation as shown by (b) in FIG. 10 is established, the ion beam orbit abnormality determining section 26 determines that the orbit of the ion beam 3 is abnormal.

As described above, according to the third embodiment, the real-time monitoring and controlling system 12 has the function of controlling the center position of the ion beam 3 on the basis of the change in magnetic field of the mass analyzing section 4 to thereby constantly control (correct) the orbit of the ion beam 3, so that the generation of the particles can be suppressed. The real-time monitoring and controlling system 12 also has the function of acquiring the relation between the magnetic field of the mass analyzing section 4 and the center position of the ion beam 3 and determining whether or not the orbit of the ion beam 3 is abnormal during the period that the ion planter does not carry out the wafer processing or after maintenance, so that the abnormality of the orbit of the ion beam 3 can be detected and a product yield and an ion implanter operating ratio can be enhanced.

In the third embodiment, the ion beam orbit correcting section 25 obtains the correction value of the magnetic field applied in the mass analyzing section 4. However, the ion beam orbit correcting section 25 may directly obtain the command value for the magnetic field applied in the mass analyzing section 4 on the basis of the characteristic shown by (a) in FIG. 10.

Fourth Embodiment

Description will be given of a fourth embodiment of the present invention with reference to FIGS. 1, 2 and 11 to 14. It is to be noted that a whole configuration of an ion implanter in the fourth embodiment is similar to that in the first embodiment; therefore, the same components are denoted by the same symbols and specific description thereof will not be given here.

As illustrated in FIG. 2, the real-time monitoring and controlling system 12 accepts an input of the number of particles on upstream and downstream sides of the aperture 5 measured by the particle monitors 6a and 6b, through the ion implanter controller 13, and an input of the current value of the ion beam 3 measured by the dose controller 9.

As illustrated in FIG. 2, the real-time monitoring and controlling system 12 includes a first ion beam diameter adjusting section 27 and a second ion beam diameter adjusting section 28.

In accordance with the number of particles measured by the particle monitors 6a and 6b, the first ion beam diameter adjusting section 27 sets a suppression voltage in the aperture. 5, outputs the suppression voltage thus set to the ion implanter controller 13, and adjusts a diameter of the ion beam 3.

The second ion beam diameter adjusting section 28 previously acquires and stores a relation between an amount of an ion beam current and a width of an ion beam acquired on different conditions of ion species and acceleration energy. In accordance with the number of particles measured by the particle monitors 6a and 6b, the second ion beam diameter adjusting section 28 sets the amount of the ion beam current on the basis of the relation between the amount of the ion beam current and the width of the ion beam, outputs the amount of the ion beam current thus set to the dose controller 9, and adjusts a diameter of the ion beam 3.

Figure 11:
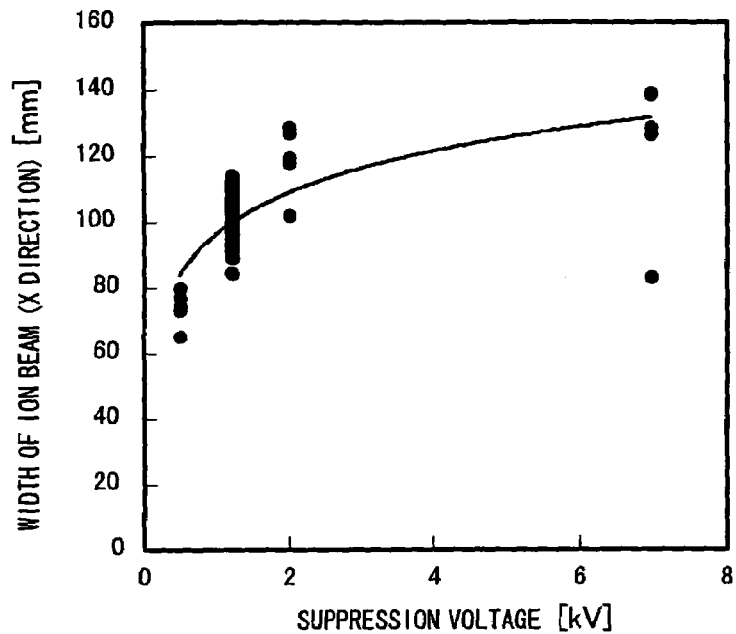
FIG. 11 is a plot showing a relation between a suppression voltage of an aperture and a width of an ion beam (in an X direction) in the ion implanter.
Figure 12:
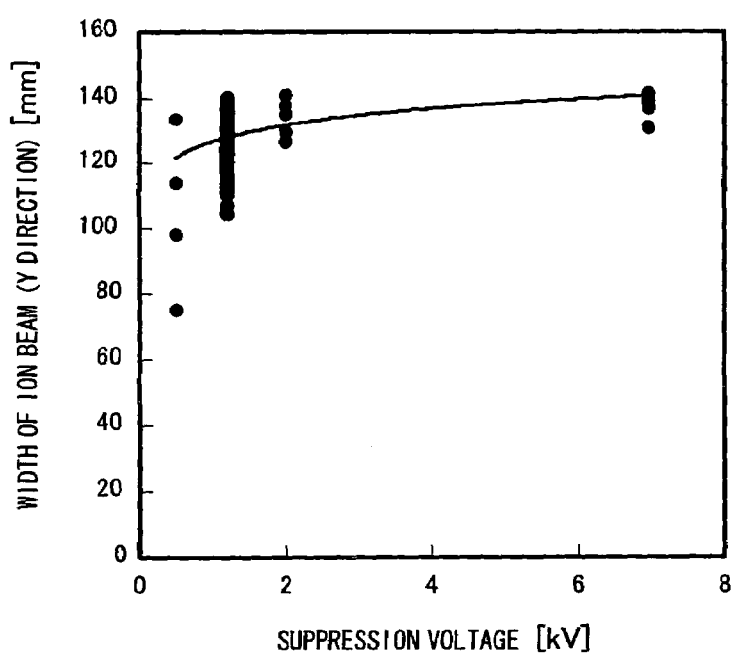
FIG. 12 is a plot showing a relation between a suppression voltage of an aperture and a width of an ion beam (in a Y-direction) in the ion implanter.

FIGS. 11 and 12 show a relation between a suppression voltage applied to the aperture 5 (see FIG. 1) and a width of the ion beam 3, respectively.

It is apparent from FIGS. 11 and 12 that when the suppression voltage is allowed to rise, the width of the ion beam 3 enlarges. Such a suppression voltage is loaded such that particles on the upstream side of the aperture 5 do not move toward the downstream side of the aperture 5. Accordingly, when the suppression voltage is allowed to rise, the number of particles on the upstream side of the aperture 5 can be reduced. However, since the width of the ion beam 3 enlarges, the ion beam 3 is easily applied to, for example, a plasma shower tube and the like located on the downstream side of the aperture 5; thus, particles are easily generated. In contrast, when the suppression voltage is allowed to drop, particles are hardly generated on the downstream side of the aperture 5; however, particles on the upstream side of the aperture 5 easily reach the wafer 8.

The first ion beam diameter adjusting section 27 utilizes this nature to monitor the number of particles measured by the particle monitors 6a and 6b placed on the upstream and downstream sides of the aperture 5. If the number of particles on the upstream side is large, the first ion beam diameter adjusting section 27 rises the suppression voltage beyond a predetermined value. If the number of particles on the downstream side is large, the first ion beam diameter adjusting section 27 drops the suppression voltage, outputs a set value thereof to the ion implanter controller 13, and controls the suppression voltage of the aperture 5 to control the width of the ion beam 3. Thus, the number of particles can be reduced. However, if the number of particles measured by the particle monitors 6a and 6b increases in the entire ion implanter, maintenance should be carried out.

Figure 13:
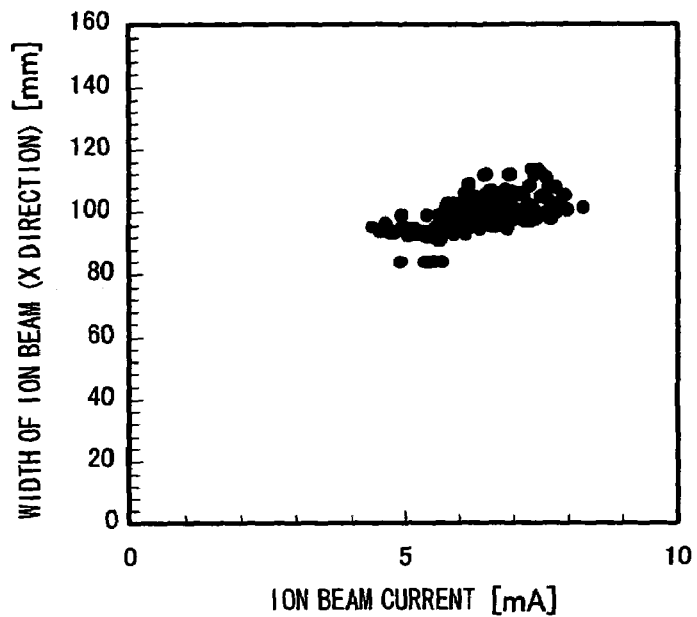
FIG. 13 is a plot showing a relation between an ion beam current and a width of an ion beam (in an X direction) in the ion implanter.
Figure 14:
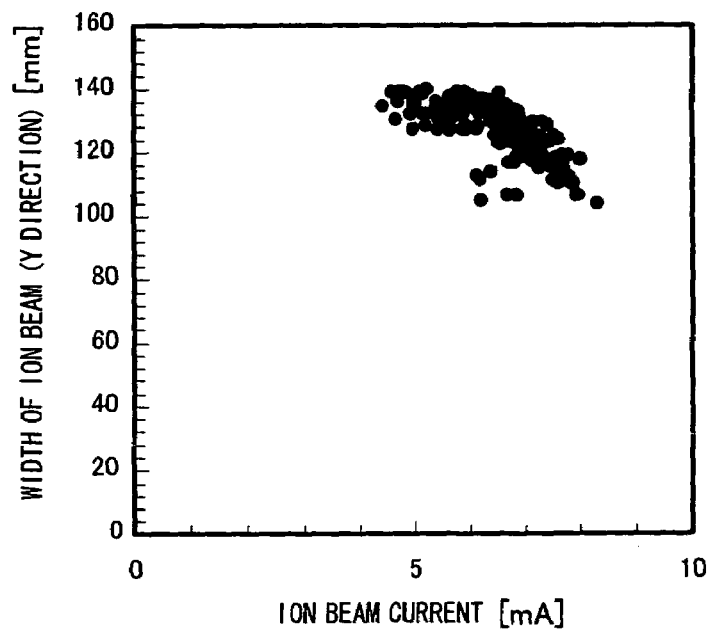
FIG. 14 is a plot showing a relation between an ion beam current and a width of an ion beam (in a Y direction) in the ion implanter.

FIGS. 13 and 14 show a relation between an ion beam current and a width of the ion beam 3, respectively. It is generally considered as follows. If the ion beam current is decreased, a space charge effect is suppressed and a diameter of the ion beam 3 becomes small. Such disadvantages are not always caused depending on conditions. As shown in FIGS. 13 and 14, the shape of the ion beam 3 alters by the change in ion beam current.

The second ion beam diameter adjusting section 28 previously acquires the relation between an amount of the ion beam current and the width of the ion beam 3 acquired on different conditions of ion species and acceleration energy. The second ion beam diameter adjusting section 28 utilizes the characteristic that the shape of the ion beam 3 alters by the change in ion beam current, sets the amount of the ion beam current on the basis of the number of particles measured by the particle monitors 6a and 6b, outputs the amount of the ion beam current thus set to the dose controller 9, and adjusts the diameter of the ion beam 3. For example, in the case that the slit is formed into a shape which is long in the X direction and short in the Y direction, as the width of the ion beam 3 in the Y direction is large, the application amount of the ion beam 3 to the slit is increased, so that particles are easily generated. In this case, accordingly, the width of the ion beam 3 in the Y direction must be made small. In the examples shown in FIGS. 13 and 14, conversely, particles are hardly generated if the amount of the ion beam current is increased. As described above, the width of the ion beam 3 is controlled, so that the generation of particles can be suppressed.

As described above, according to the fourth embodiment, the real-time monitoring and controlling system 12 has the function of changing the amount of the ion beam current on the basis of the suppression voltage in the aperture 5 or the number of particles measured by the particle monitors 6a and 6b provided for measuring the number of particles in the ion implanter, and adjusting the diameter of the ion beam 3; therefore, it is possible to suppress the generation of particles, and to enhance a product yield and an ion implanter operating ratio.

What is claimed is:

1. An ion implanter comprising:
    an ion source;
    an extraction accelerating section for extracting an ion beam from the ion source;
    a mass analyzing section for acquiring desired ions from the ion beam extracted by the extraction accelerating section;
    a wafer holding section for holding a wafer in which ions are implanted;
    an aperture for removing redundant ions and particles from an ion beam outputted from the mass analyzing section so that such ions and particles do not reach the wafer held by the wafer holding section;
    a dose controller for measuring an ion beam current during the implantation of ions in the wafer and controlling an amount of ions to be implanted in the wafer;
    a mechanical scan mechanism for allowing the wafer holding section to reciprocate;
    a mechanical scan mechanism controller for measuring a mechanical scan position of the wafer holding section reciprocated by the mechanical scan mechanism and a mechanical scan speed of the mechanical scan mechanism, and controlling the mechanical scan mechanism;
    an accumulated dose distribution computing section for obtaining a dose distribution in a mechanical scan direction of the wafer held by the wafer holding section from the ion beam current measured by the dose controller and the mechanical scan speed and the mechanical scan position each measured by the mechanical scan mechanism controller, and accumulating the dose distribution thus obtained to obtain an accumulated dose distribution of the wafer in the mechanical scan direction, for each mechanical scan of the wafer holding section by the mechanical scan mechanism;
    an accumulated dose distribution uniformity computing section for computing accumulated dose distribution uniformity from the accumulated dose distribution obtained by the accumulated dose distribution computing section, for each mechanical scan; and
    a mechanical scan speed computing and correcting section for calculating a mean value of the accumulated dose distribution obtained by the accumulated dose distribution computing section, for obtaining a distribution correction amount of an accumulated dose obtained by deducting the accumulated dose distribution from the mean value, for obtaining a correction value for correcting the mechanical scan speed so as to render an accumulated dose invariant, the accumulated dose having the accumulated dose distribution correction amount taken into consideration in a subseciuent mechanical scan, and for outputting the correction value to the mechanical scan mechanism controller, for each mechanical scan, wherein the mechanical scan mechanism controller corrects the mechanical scan speed in accordance with the mechanical scan speed correction value.

2. The ion implanter according to claim 1, further comprising:
    an ion implanter interlock determining section for determining whether or not the accumulated dose distribution uniformity obtained by the accumulated dose distribution uniformity computing section exceeds a preset value, and when it is determined that the uniformity exceeds the preset value, outputting a wafer processing stop command, for each mechanical scan.

3. The ion implanter according to claim 2, wherein
    the dose controller measures a center position of the ion beam during the implantation of ions in the wafer,
    the mass analyzing section measures a magnetic field thereof, and
    the ion implanter comprises an ion beam orbit correcting section for obtaining a command value or a correction value for controlling the magnetic field of the mass analyzing section from the center position of the ion beam measured by the dose controller and the magnetic field of the mass analyzing section measured by the mass analyzing section, changing the magnetic field of the mass analyzing section based on the command value or the correction value to control the center position of the ion beam, and correcting an orbit of the ion beam.

4. The ion implanter according to claim 1, wherein
the dose controller measures a center position of the ion beam during the implantation of ions in the wafer,
the mass analyzing section measures a magnetic field thereof, and
the ion implanter comprises an ion beam orbit correcting section for obtaining a command value or a correction value for controlling the magnetic field of the mass analyzing section from the center position of the ion beam measured by the dose controller and the magnetic field of the mass analyzing section measured by the mass analyzing section, changing the magnetic field of the mass analyzing section based on the command value or the correction value to control the center position of the ion beam, and correcting an orbit of the ion beam.

5. The ion implanter according to claim 4, further comprising an ion beam orbit abnormality determining section for determining whether or not the orbit of the ion beam is abnormal, based on the center position of the ion beam measured by the dose controller and the magnetic field of the mass analyzing section measured by the mass analyzing section, during a period that the ion implanter does not carry out the wafer processing or after maintenance.

6. The ion implanter according any one of claims 1 to 5, further comprising a particle monitor for measuring, in number, particles in the ion implanter, wherein
the ion implanter includes at least one of:
a first ion beam diameter adjusting section for controlling a suppression voltage in the aperture and varying the suppression voltage to adjust a diameter of the ion beam, based on the number of particles measured by the particle monitor; and
a second ion beam diameter adjusting section for varying an amount of an ion beam current by means of the dose controller to adjust a diameter of the ion beam, based on the number of particles measured by the particle monitor.

7. The ion implanter according to claim 6, wherein the second ion beam diameter adjusting section varies the amount of the ion beam current to control a width of the ion beam, based on a relation between an amount of an ion beam current and a width of an ion beam previously acquired under different conditions of ion species and acceleration energy.

8. An ion implantation control method of an ion implanter comprising:
an ion source;
an extraction accelerating section for extracting an ion beam from the ion source;
a mass analyzing section for acquiring desired ions from the ion beam extracted by the extraction accelerating section;
a wafer holding section for holding a wafer in which ions are implanted;
an aperture having a function of removing redundant ions and particles from an ion beam outputted from the mass analyzing section so that such ions and particles do not reach the wafer held by the wafer holding section;
a dose controller for measuring an ion beam current during the implantation of ions in the wafer to control an amount of ions to be implanted in the wafer;
a mechanical scan mechanism for allowing the wafer holding section to reciprocate; and
a mechanical scan mechanism controller for measuring a mechanical scan position of the wafer holding section reciprocated by the mechanical scan mechanism and a mechanical scan speed of the mechanical scan mechanism to control the mechanical scan mechanism, the method comprising the steps of:
obtaining a dose distribution in a mechanical scan direction of the wafer held by the wafer holding section, from the ion beam current measured by the dose controller and the mechanical scan speed and the mechanical scan position each measured by the mechanical scan mechanism controller, and accumulating the dose distribution thus obtaining to obtain an accumulated dose distribution of the wafer in the mechanical scan direction, for each mechanical scan of the wafer holding section by the mechanical scan mechanism;
computing accumulated dose distribution uniformity from the accumulated dose distribution thus obtained, for each mechanical scan; and
calculating a mean value of the accumulated dose distribution from an accumulated dose distribution at a certain point in time, obtaining a distribution correction amount of an accumulated dose obtained by deducting the accumulated dose distribution from the mean value, obtaining a correction value for correcting the mechanical scan speed so as to render an accumulated dose invariant, the accumulated dose having the accumulated dose distribution correction amount taken into consideration in a subsequent mechanical scan, and correcting the mechanical scan speed in accordance with the correction value, for each mechanical scan.

9. The ion implantation control method according to claim 8, further comprising:
determining whether the accumulated dose distribution uniformity exceeds a preset value and, when the uniformity exceeds the preset value, stopping wafer processing.

10. The ion implantation control method according to claim 9, further comprising:
measuring a center position of the ion beam during the implantation of ions in the wafer, and measuring a magnetic field of the mass analyzing section; and
controlling the magnetic field of the mass analyzing section based on the measured center position of the ion beam and the measured magnetic field of the mass analyzing section, and changing the magnetic field of the mass analyzing section to control the center position of the ion beam and correct an orbit of the ion beam.

11. The ion implantation control method according to claim 8, further comprising:
measuring a center position of the ion beam during the implantation of ions in the wafer, and measuring a magnetic field of the mass analyzing section; and
controlling the magnetic field of the mass analyzing section based on the measured center position of the ion beam and the measured magnetic field of the mass analyzing section, and changing the magnetic field of the mass analyzing section to control the center position of the ion beam and correct an orbit of the ion beam.

12. The ion implantation control method according to claim 11, further comprising:
acquiring the center position of the ion beam and the magnetic field of the mass analyzing section and determining whether or not the orbit of the ion beam is abnormal, during a period that the ion implanter does not carry out the wafer processing or after maintenance.

13. The ion implantation control method according to any one of claims 8 to 12, further comprising:
measuring particles in number in the ion implanter; and carrying out at least one of an operation for varying a suppression voltage in the aperture to adjust a diameter of the ion beam, and an operation for varying the amount of the ion beam current to adjust the diameter of the ion beam, each based on the measured number of particles.

14. The ion implantation control method according to claim 13, further comprising:
upon varying the amount of the ion beam current to adjust the diameter of the ion beam, varying the ion beam current to control the width of the ion beam, based on a relation between an amount of an ion beam current and a width of an ion beam previously acquired on different conditions of ion species and acceleration energy.

* * * * *